(12) United States Patent
Lee et al.

(10) Patent No.: US 9,178,178 B2
(45) Date of Patent: Nov. 3, 2015

(54) ORGANIC LIGHT-EMITTING DIODE DISPLAY HAVING IMPROVED ADHESION AND DAMAGE RESISTANCE CHARACTERISTICS, AN ELECTRONIC DEVICE INCLUDING THE SAME, AND METHOD OF MANUFACTURING THE ORGANIC LIGHT-EMITTING DIODE DISPLAY

(71) Applicant: Samsung Display Co., Ltd., Yongin, Gyeonggi-Do (KR)

(72) Inventors: Jae-Seob Lee, Yongin (KR); Yong-Hwan Park, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/280,526

(22) Filed: May 16, 2014

(65) Prior Publication Data

US 2014/0339527 A1    Nov. 20, 2014

Related U.S. Application Data

(63) Continuation-in-part of application No. 14/175,882, filed on Feb. 7, 2014.

(30) Foreign Application Priority Data

May 16, 2013 (KR) .................. 10-2013-0056042
Mar. 6, 2014 (KR) .................. 10-2014-0026816
May 16, 2014 (KR) .................. 10-2014-0059222

(51) Int. Cl.
*H01L 51/52*    (2006.01)
*H01L 27/32*    (2006.01)
*H01L 51/00*    (2006.01)

(52) U.S. Cl.
CPC ............ *H01L 51/5256* (2013.01); *H01L 27/32* (2013.01); *H01L 51/0097* (2013.01); *H01L 51/524* (2013.01)

(58) Field of Classification Search
None
See application file for complete search history.

(56) References Cited

U.S. PATENT DOCUMENTS

| 6,268,695 | B1 | 7/2001 | Affinito | |
| 6,849,877 | B2 * | 2/2005 | Yamazaki et al. | 257/86 |
| 7,446,473 | B2 | 11/2008 | Tanaka | |
| 8,766,280 | B2 * | 7/2014 | Thoumazet et al. | 257/79 |

(Continued)

FOREIGN PATENT DOCUMENTS

| EP | 2091096 A1 | 8/2009 |
| JP | 2005347083 A | 12/2005 |

(Continued)

OTHER PUBLICATIONS

Benoit D. et al., "Determination of silicon nitride film chemical composition to study hydrogen desorption mechanisms", Thin Solid Films, vol. 519, Issue No. 19, pp. 6550-6553, Apr. 30, 2011.

*Primary Examiner* — Scott B Geyer
(74) *Attorney, Agent, or Firm* — Innovation Counsel LLP

(57) ABSTRACT

Provided is an organic light-emitting diode (OLED) display including: first and second plastic layers; a first barrier layer and a first intermediate layer each positioned between the first and second plastic layers; and an OLED layer formed on the second plastic layer. The first barrier layer comprises silicon nitride.

8 Claims, 11 Drawing Sheets

(56) References Cited

U.S. PATENT DOCUMENTS

| | | |
|---|---|---|
| 2002/0140347 A1 | 10/2002 | Weaver |
| 2007/0222370 A1 | 9/2007 | Zhu et al. |
| 2009/0289255 A1 | 11/2009 | Lee et al. |
| 2011/0193067 A1 | 8/2011 | Lee et al. |
| 2012/0034451 A1 * | 2/2012 | Seo et al. .................. 428/332 |

FOREIGN PATENT DOCUMENTS

| | | |
|---|---|---|
| KR | 1020080004232 A | 1/2008 |
| KR | 20080104324 A | 12/2008 |
| KR | 1020090121894 A | 11/2009 |
| KR | 1020130109393 A | 10/2013 |
| KR | 1020130114375 A | 10/2013 |

* cited by examiner

LASER BEAM

ORGANIC LIGHT-EMITTING DIODE DISPLAY HAVING IMPROVED ADHESION AND DAMAGE RESISTANCE CHARACTERISTICS, AN ELECTRONIC DEVICE INCLUDING THE SAME, AND METHOD OF MANUFACTURING THE ORGANIC LIGHT-EMITTING DIODE DISPLAY

RELATED APPLICATIONS

This application is a continuation-in-part of U.S. patent application Ser. No. 14/175,882 which was filed on Feb. 7, 2014, and also claims the benefit of Korean Patent Application No. 10-2013-0056042, filed on May 16, 2013, Korean Patent Application No. 10-2014-0026816, filed on Mar. 6, 2014, and Korean Patent Application No. 10-2014-0059222, filed on May 16, 2014, which were filed in the Korean Intellectual Property Office, the disclosures of all of which are incorporated herein in their entirety by reference.

BACKGROUND

1. Field

One or more embodiments of the present invention relate generally to an organic light-emitting diode (OLED) display. More specifically, one or more embodiments of the present invention relate to an OLED display including a flexible substrate, an electronic device including the OLED display, and a method of manufacturing the OLED display.

2. Description of the Related Art

An organic light-emitting diode (OLED) display is a self-emission type display that includes a hole injection electrode, an electron injection electrode, and an organic emission layer disposed therebetween, wherein a light is emitted as holes injected from the hole injection electrode and electrons injected from the electron injection electrode are recombined in the organic emission layer. The OLED display has been attracting attention as a potential next generation display due to its high quality characteristics, such as low power consumption, excellent luminance, and high response speed.

SUMMARY

One or more embodiments of the present invention include an organic light-emitting diode (OLED) display including a flexible substrate that has a low water vapor transmission rate and high adhesive strength, and a method of manufacturing the OLED display.

In one embodiment, an organic light-emitting diode (OLED) display includes first and second plastic layers; a first barrier layer and a first intermediate layer each positioned between the first and second plastic layers; and an OLED layer formed on the second plastic layer. The first barrier layer may include silicon nitride.

The silicon nitride may be present within the first barrier layer at a density of equal to or more than 2.2 $g/cm^3$ and less than or equal to 2.4 $g/cm^3$.

The OLED display may further include a second barrier layer formed on the second plastic layer. The second barrier layer may include silicon nitride.

A density of the silicon nitride in the first barrier layer may be lower than a density of the silicon nitride in the second barrier layer.

A refractive index of the first barrier layer may be lower than a refractive index of the second barrier layer.

The OLED display may further include a third plastic layer formed over the second plastic layer, and a third barrier layer formed between the second and third plastic layers. The third barrier layer may include silicon nitride.

A density of the silicon nitride in the first barrier layer may be lower than a density of the silicon nitride in the third barrier layer.

A refractive index of the first barrier layer may be lower than a refractive index of the third barrier layer.

The silicon nitride may be present within the first barrier layer at a density of equal to or more than 2.2 $g/cm^3$ and less than or equal to 2.4 $g/cm^3$.

In another embodiment, a method of manufacturing an OLED display may include forming a mother flexible substrate, the mother flexible substrate including first and second plastic layers, and a first barrier layer and a first intermediate layer each positioned between the first and second plastic layers. Also included may be forming a plurality of OLED layers on the mother flexible substrate; and dividing the mother flexible substrate into a plurality of display units each including one of the OLED layers. The first barrier layer may include silicon nitride.

The method may further include receiving a carrier substrate, wherein the forming a mother flexible substrate further includes forming the mother flexible substrate on the carrier substrate; and separating the carrier substrate from the mother flexible substrate.

In the method, the silicon nitride may be present within the first barrier layer at a density of equal to or more than 2.2 $g/cm^3$ and less than or equal to 2.4 $g/cm^3$.

The method may further include forming a second barrier layer on the second plastic layer. The second barrier layer may include silicon nitride.

In the method, a density of the silicon nitride in the first barrier layer may be lower than a density of the silicon nitride in the second barrier layer.

In the method, a refractive index of the first barrier layer may be lower than a refractive index of the second barrier layer.

The method may further include forming a third plastic layer over the second plastic layer; and forming a third barrier layer between the second and third plastic layers. The third barrier layer may include silicon nitride.

In the method, a density of the silicon nitride in the first barrier layer may be lower than a density of the silicon nitride in the third barrier layer.

In the method, a refractive index of the first barrier layer may be lower than a refractive index of the third barrier layer.

In the method, the silicon nitride may be present within the first barrier layer at a density of equal to or more than 2.2 $g/cm^3$ and less than or equal to 2.4 $g/cm^3$.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
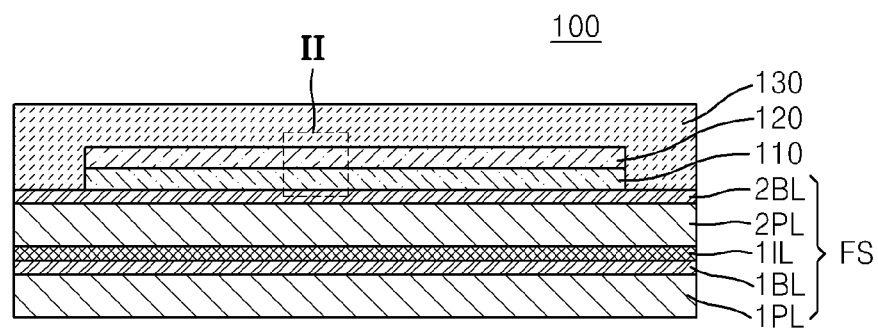
FIG. 1 is a cross-sectional view of an organic light-emitting diode (OLED) display according to an embodiment of the present invention.

The present invention will now be described more fully with reference to the accompanying drawings for those of ordinary skill in the art to be able to perform the present invention without any difficulty. The invention may, however, be embodied in many different forms and should not be construed as being limited to the embodiments set forth herein.

Also, parts in the drawings unrelated to the detailed description are omitted to ensure clarity of the present invention. Like reference numerals in the drawings denote like elements, and thus their description will not be repeated.

The same elements denoted by the same reference numerals will be explained in a representative first embodiment and other embodiments will be explained by focusing on elements other than the elements in the first embodiment.

In the drawings, sizes and thicknesses of elements are arbitrarily shown for convenience of explanation, and thus the present invention is not limited thereto.

Thicknesses of various layers and regions in the drawings are expanded for clarity. Thicknesses of some layers and regions are exaggerated for convenience of explanation. It will be understood that when a layer, film, region, or plate is referred to as being "on" another layer, film, region, or plate, it may be directly on the other layer, film, region, or plate or intervening layers, films, regions, or plates elements may be present.

It will be further understood that the terms "includes" and/or "including" used herein specify the presence of stated features, integers, steps, operations, members, components, and/or groups thereof, but do not preclude the presence or addition of one or more other features, integers, steps, operations, members, components, and/or groups thereof. When an element is referred to as being disposed "on" another element, the term "on" may encompass both orientations of "over" and "under", that is, not only "over" in a gravity direction.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of an organic light-emitting diode (OLED) display 100 according to an embodiment of the present invention.

Referring to FIG. 1, the OLED display 100 includes a flexible substrate FS, a thin-film transistor (TFT) layer 110, an OLED layer 120, and a thin-film encapsulation layer 130.

The flexible substrate FS includes a first plastic layer 1PL, a first barrier layer 1BL, a first intermediate layer 1IL, a second plastic layer 2PL, and a second barrier layer 2BL.

The first and second plastic layers 1PL and 2PL may be formed of a plastic material having excellent thermal resistance and excellent durability, such as polyimide, polyiminde, polyethylene naphthalate, polyethylene terephthalate (PET), polyarylate, polycarbonate, polyether imide (PEI), or polyethersulfone.

Since moisture or oxygen easily penetrates through the first and second plastic layers 1PL and 2PL formed of the plastic material as compared to a glass substrate, the OLED layer 120, which is vulnerable to moisture or oxygen, may deteriorate, and thus a lifespan of the OLED display 100 may be reduced.

Accordingly, the first barrier layer 1BL is formed on the first plastic layer 1PL and the second barrier layer 2BL is formed on the second plastic layer 2PL.

The first and second barrier layers 1BL and 2BL may be formed of an inorganic material, such as a metal oxide, a silicon nitride, or a silicon oxide. For example, the first and second barrier layers 1BL and 2BL may each be a single layer or multilayer of an inorganic material, such as AlO3, SiO2, or SiNx. A water vapor transmission rate (WVTR) of the first and second barrier layers 1BL and 2BL formed as single layers or multilayers may be lower than or equal to 10-5 (g/m$^2$/day).

The first intermediate layer 1IL may be formed between the first barrier layer 1BL and the second plastic layer 2PL in order to increase an adhesive strength between the first barrier layer 1BL and the second plastic layer 2PL, as will be described in detail later.

The TFT layer 110 and the OLED layer 120 are formed on the flexible substrate FS.

Figure 2:
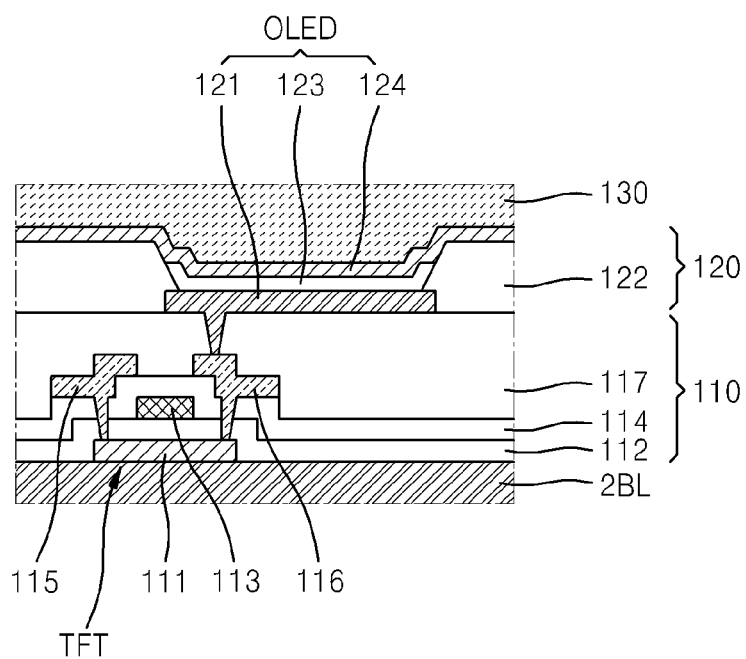
FIG. 2 is an enlarged view of a region II of FIG. 1, illustrating parts of a thin-film transistor (TFT) layer and OLED layer of the OLED display.

FIG. 2 is an enlarged view of a region II of FIG. 1, illustrating parts of the TFT layer 110 and the OLED layer 120 of the OLED display 100.

Referring to FIG. 2, a TFT including a semiconductor layer 111, a gate electrode 113, a source electrode 115, and a drain electrode 116 may be formed on the second barrier layer 2BL. A gate insulation film 112 may be formed between the semiconductor layer 111 and the gate electrode 113, and an interlayer insulation film 114 may be formed between the gate electrode 113 and the source electrode 115 and between the gate electrode 113 and the drain electrode 116. Here, the semiconductor layer 111 may be amorphous silicon, an organic layer, or a conductive oxide. In FIG. 2, a top gate type TFT is shown, but the present invention is not limited thereto. In other words, a TFT having any one of various structures including a bottom gate type TFT may be used.

Meanwhile, in FIG. 2, the TFT is directly formed on the second barrier layer 2BL, but the present invention is not limited thereto. A buffer layer (not shown) may be further disposed between the second barrier layer 2BL and the TFT.

The buffer layer flattens the flexible substrate FS and prevents impure elements from penetrating into the semiconductor layer 111 from the flexible substrate FS. In the buffer layer, a silicon nitride and/or silicon oxide may be arranged as a single layer or a plurality of layers. Also, although not shown in FIG. 2, at least one capacitor may be connected to the TFT.

A passivation layer 117 may be formed on the TFT, and a pixel-defining layer 122 may be formed on the passivation layer 117. The passivation layer 117 may protect the TFT and flatten or planarize a top surface of the TFT.

An OLED may be connected to one of the source and drain electrodes 115 and 116 of the TFT. The OLED may include a pixel electrode 121, a counter electrode 124, and a layer 123 including at least an organic emission layer disposed between the pixel and counter electrodes 121 and 124. The layer 123 may be formed of a low molecular or high molecular organic material. When a low molecular organic material is used, the layer 123 may have a single or complex structure of a hole injection layer (HIL), a hole transport layer (HTL), an emission layer (EML), an electron transport layer (ETL), and an electron injection layer (EIL). When a high molecular organic material is used, the layer 123 may have a structure including an HTL and an EML. The layer 123 may form one unit pixel by using sub-pixels emitting red, green, and blue lights. The layer 123 may be formed as separate layers each including emission materials emitting one of red, green, and blue light and each being perpendicularly stacked on each other, or may be formed as layers each having a mix of differently-colored emission materials. Of course, any other combination of colors may be used as long as a white light is emitted. In addition, the OLED display 100 may further include a color changing layer or color filter that changes the white light to a predetermined color.

The counter electrode 124 may be variously modified, for example, may be commonly formed throughout or across a plurality of pixels.

The pixel electrode 121 may operate as an anode and the counter electrode 124 may operate as a cathode, or vice versa. Also, at least one of the pixel electrode 121 and the counter electrode 124 may be a transparent electrode through which a light emitted from the EML penetrates.

In FIGS. 1 and 2, the OLED layer 120 is formed on the TFT layer 110 for convenience of description. Thus, for example, parts of the TFT layer 110 and OLED layer 120 may be formed on the same layer. For example, the gate electrode 113 of the TFT and the pixel electrode 121 of the OLED may be formed on the same layer.

The thin-film encapsulation layer 130 encapsulating the OLED is formed on the flexible substrate FS. The thin-film encapsulation layer 130 may be formed of a plurality of inorganic layers or a combination of an inorganic layer and an organic layer.

The organic layer may be formed of a polymer, and for example, may be a single layer or a multilayer formed of any one of polyethylene terephthalate, polyimide, polycarbonate, epoxy, polyethylene, and polyacrylate. The organic layer may be formed of polyacrylate, and in detail, may include a polymerized monomer composition including a diacrylate-based monomer and a triacrylate-based monomer. A monoacrylate-based monomer may be further included in the polymerized monomer composition. Also, the polymerized monomer composition may include a well known photoinitiator, such as TPO, but is not limited thereto.

The inorganic layer may be a single layer or a multilayer including a metal oxide or a metal nitride. In detail, the inorganic layer may include any one of SiNx, Al2O3, SiO2, and TiO2.

An uppermost layer of the thin-film encapsulation layer 130, which is externally exposed, may be formed of an inorganic layer in order to prevent water vapor transmission to the OLED.

The thin-film encapsulation layer 130 may include at least one sandwich structure, wherein at least one organic layer is inserted between at least two inorganic layers. Alternatively, the thin-film encapsulation layer 130 may include at least one sandwich structure, wherein at least one inorganic layer is inserted between at least two organic layers.

The thin-film encapsulation layer 130 may include a first inorganic layer, a first organic layer, and a second inorganic layer sequentially stacked from a top of the OLED. Alternatively, the thin-film encapsulation layer 130 may include a first inorganic layer, a first organic layer, a second inorganic layer, a second organic layer, and a third inorganic layer sequentially stacked from the top of the OLED. Alternatively, the thin-film encapsulation layer 130 may include a first inorganic layer, a first organic layer, a second inorganic layer, a second organic layer, a third inorganic layer, a third organic layer, and a fourth inorganic layer sequentially stacked from the top of the OLED. It should be noted that embodiments of the invention are not strictly limited to this configuration of layers, and any other suitable combination or order of layers is contemplated.

A halogenated metal layer including LiF may be further disposed between the OLED and the first inorganic layer. The halogenated metal layer may prevent the OLED from being damaged while forming the first inorganic layer via a sputtering method or a plasma deposition method.

The first organic layer may have a smaller area than the second inorganic layer, and the second organic layer may have a smaller area than the third inorganic layer. Also, the first organic layer may be completely covered by the second inorganic layer, and the second organic layer may be completely covered by the third inorganic layer.

Meanwhile, in FIGS. 1 and 2, the thin-film encapsulation layer 130 is directly formed on the counter electrode 124, but alternatively, another component, such as a filler or an adhesive material, may be further disposed between the counter electrode 124 and the thin-film encapsulation layer 130.

Figure 3:
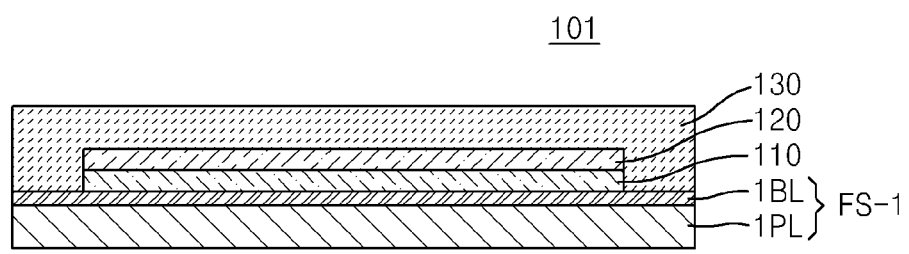
FIG. 3 is a cross-sectional view of an OLED display according to a comparative example.

FIG. 3 is a cross-sectional view of an OLED display 101 according to a comparative example.

Referring to FIG. 3, the OLED display 101 includes a flexible substrate FS-1 the TFT layer 110, the OLED layer 120, and the thin-film encapsulation layer 130.

The flexible substrate FS-1 includes the first plastic layer 1PL and the first barrier layer 1BL. In other words, the flexible substrate FS-1 includes one plastic layer and one barrier layer.

As shown in the comparative example, when the flexible substrate FS-1 is formed only of one plastic layer and one barrier layer, the first barrier layer 1BL may be damaged, for example, cracked, due to impurities or retraction defects formed on the first plastic layer 1PL and/or the first barrier layer 1BL. Moisture or oxygen may penetrate through such a damaged surface, in turn damaging the OLED.

Figure 4:
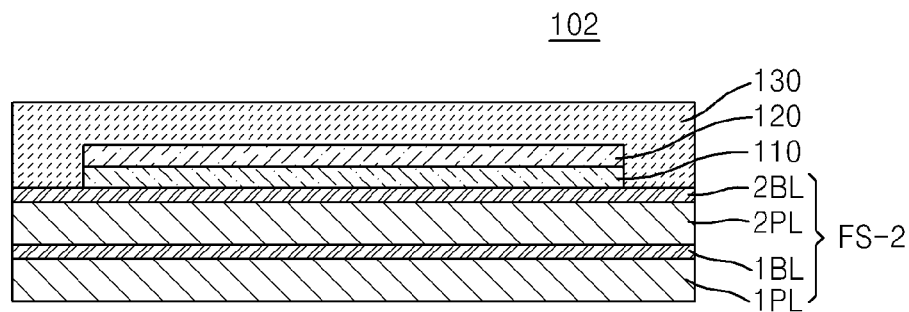
FIG. 4 is a cross-sectional view of an OLED display according to another embodiment of the present invention.

FIG. 4 is a cross-sectional view of an OLED display 102 according to another embodiment of the present invention.

Referring to FIG. 4, the OLED display 102 includes a flexible substrate FS-2, the TFT layer 110, the OLED layer 120, and the thin-film encapsulation layer 130.

The flexible substrate FS-2 includes the first plastic layer 1PL, the first barrier layer 1BL, the second plastic layer 2PL, and the second barrier layer 2BL. In other words, in the flexible substrate FS-2, a structure of a plastic layer and a barrier layer formed on the plastic layer is repeatedly formed twice.

Impurities or retraction defects may be randomly formed not only in the first plastic layer 1PL and the first barrier layer 1BL, but also in the second plastic layer 2PL and the second barrier layer 2BL. However, since an average water vapor transmission path from a defected region to an OLED is longer in the OLED display 102 than the OLED display 101, the OLED may be prevented from being damaged even if the first barrier layer 1BL and/or the second barrier layer 2BL are damaged, for example, cracked.

Here, dark spot defects may be reduced as the flexible substrate FS-2 has a low water vapor transmission rate, but since an adhesive strength between the first barrier layer 1BL that is an inorganic film and the second plastic layer 2PL that is an organic film is relatively weak, the first barrier layer 1BL and the second plastic layer 2PL may be detached from each other during manufacturing processes.

However, according to the OLED display 100, the first barrier layer 1BL and the second plastic layer 2PL are not detached from each other since the first intermediate layer 1IL improving the adhesive strength between the first barrier layer 1BL and the second plastic layer 2PL is formed between the first barrier layer 1BL and the second plastic layer 2PL.

The first intermediate layer 1IL may include an amorphous material. The first intermediate layer 1IL may include amorphous silicon as an example of the amorphous material.

Alternatively, the first intermediate layer 1IL may include a metal thin film. The metal thin film may include at least one selected from among indium tin oxide (ITO), aluminum (Al), titanium (Ti), and molybdenum (Mo). However, a material of the first intermediate layer 1IL is not limited to any of these materials, and any material is contemplated as long as the adhesive strength between the first barrier layer 1BL and the second plastic layer 2PL is improved.

Also, the first intermediate layer 1IL may have a UV light transmittance of at least 10% so that the second plastic layer 2PL is smoothly separated from a glass substrate GS during a process of separating a mother flexible substrate MFS and the glass substrate GS, which is described later with reference to FIGS. 11A and 11B. Accordingly, the first intermediate layer 1IL may have a thickness that is less than or equal to 100 Å.

Table 1 below shows detachment evaluation results between the first barrier layer 1BL and the second plastic layer 2PL before a structure that does not include the first intermediate layer 1IL on the flexible substrate FS-2 is divided into display units. Sample 1 uses a SiO2 single layer, Sample 2 uses a SiNx single layer, Sample 3 uses a SiO2/SiNx/SiO2 complex layer, and Sample 4 uses a SiNx/SiO2/SiNx complex layer, as the first and second barrier layers 1BL and 2BL.

TABLE 1

| Barrier Layer | Sample 1 (O) | Sample 2 (N) | Sample 3 (ONO) | Sample 4 (NON) |
|---|---|---|---|---|
| Average Adhesive Strength (gf/inch) | 67.73 | 216.41 | 82.83 | 164.38 |

Table 2 below shows detachment evaluation results between the first barrier layer 1BL and the second plastic layer 2PL in a unit of a display, after the structure that does not include the first intermediate layer 1IL on the flexible substrate FS-2 is divided into display units. Sample 5 uses a SiNx/SiO2 complex layer and Sample 6 uses a SiNx/SiO2/SiNx complex layer as the first and second barrier layers 1BL and 2BL.

TABLE 2

| Barrier Layer | Sample 5 (NO) | Sample 6 (NON) |
|---|---|---|
| Average Adhesive Strength (gf/inch) | 34.61 | 39.31 |

Table 3 below shows detachment evaluation results between the first barrier layer 1BL and the second plastic layer 2PL before a structure that includes the first intermediate layer 1IL on the flexible substrate FS is divided into display units. Sample 7 uses ITO, Sample 8 uses Ti, and Sample 9 uses Al, as the first intermediate layer 1IL. Also, Sample 10 forms the first intermediate layer 1IL for 5 seconds by using a-Si, and Sample 11 forms the first intermediate layer 1IL for 10 seconds by using a-Si. In Samples 7 through 11, the first and second barrier layers 1BL and 2BL are formed by using a SiNx/SiO2 complex layer respectively in thicknesses of 600 Å and 1500 Å.

TABLE 3

| Intermediate Layer | Sample 7 (ITO) | Sample 8 (Ti) | Sample 9 (Al) | Sample 10 (a-Si) | Sample 11 (a-Si) |
|---|---|---|---|---|---|
| Average Adhesive Strength (gf/inch) | Undetachable | Undetachable | Undetachable | 126.27 | 328.24 |

Table 4 below shows detachment evaluation results between the first barrier layer 1BL and the second plastic layer 2PL in a display unit after the structure that includes the first intermediate layer 1IL on the flexible substrate FS is divided into display units. Samples 7 through 11 are the same as those in Table 3.

TABLE 4

| Intermediate Layer | Sample 7 (ITO) | Sample 8 (Ti) | Sample 9 (Al) | Sample 10 (a-Si) | Sample 11 (a-Si) |
|---|---|---|---|---|---|
| Average Adhesive Strength (gf/inch) | Undetachable | Undetachable | Undetachable | Undetachable | Undetachable |

Referring to Table 1, before the structure that does not include the first intermediate layer 1IL is divided into display units, an average adhesive strength between the first barrier layer 1BL and the second plastic layer 2PL is from about 60 to about 200 gf/inch, and referring to Table 2, an average adhesive strength between the first barrier layer 1BL and the second plastic layer 2PL in a display unit after the structure is divided into display units is from about 35 to about 40 gf/inch, i.e., low.

However, referring to Table 3, before the structure that includes the first intermediate layer 1IL is divided into display units, i) an average adhesive strength between the first barrier layer 1BL and the second plastic layer 2PL with an a-Si first intermediate layer 1IL is from about 100 to about 300 gf/inch and ii) the first barrier layer 1BL and the second plastic layer 2PL are undetachable in the metal thin films. Referring to Table 4, the first barrier layer 1BL and the second plastic layer 2PL are undetachable in a display unit after the structure that includes the first intermediate layer 1IL is divided into display units, and thus an average adhesive strength is not measurable. In other words, when the first intermediate layer 1IL is disposed between the first barrier layer 1BL and the second plastic layer 2PL, an adhesive strength between the first barrier layer 1BL and the second plastic layer 2PL significantly increases.

Accordingly, in the OLED display 100 of the embodiment of the present invention, not only is an average water vapor transmission path increased, but also an adhesive strength between a lower barrier layer and an adjacent upper plastic layer is increased so as to improve detachment defects of a display, by alternately stacking two plastic layers and two barrier layers and disposing an intermediate layer between the adjacent plastic and barrier layers to form the flexible substrate FS.

Figure 17:
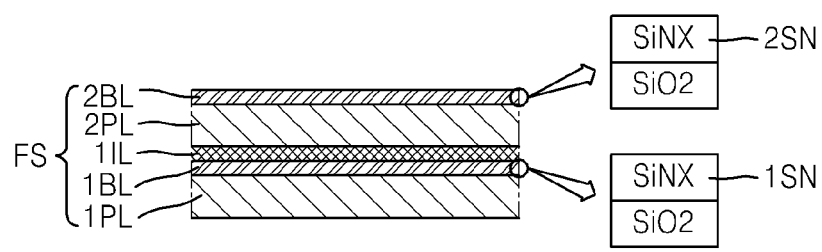
FIG. 17 is a cross-sectional view of an example of a flexible substrate of the OLED display of FIG. 1.

FIG. 17 is a view of an example of the flexible substrate FS of the OLED display 100 of FIG. 1.

Referring to FIG. 17, the flexible substrate FS includes the first plastic layer 1PL, the first barrier layer 1BL, the first intermediate layer 1IL, the second plastic layer 2PL, and the second barrier layer 2BL.

In the current embodiment, the first and second barrier layers 1BL and 2BL respectively include at least one silicon nitride film 1SN and at least one silicon nitride film 2SN. The density of a silicon nitride in the at least one silicon nitride film 1SN of the first barrier layer 1BL may be less than the density of a silicon nitride of the at least one silicon nitride film 2SN of the second barrier layer 2B. For example, the density of the silicon nitride of the at least one silicon nitride film 1SN of the first barrier layer 1BL may be equal to or more than 2.2 g/cm$^3$ and less than or equal to 2.4 g/cm$^3$.

In order to prevent water vapor transmission through a plastic substrate, at least one layer of the first and second barrier layers 1BL and 2BL is formed of a silicon nitride, but a hydrogen content of the silicon nitride may affect a device characteristic of a TFT.

Figure 18:
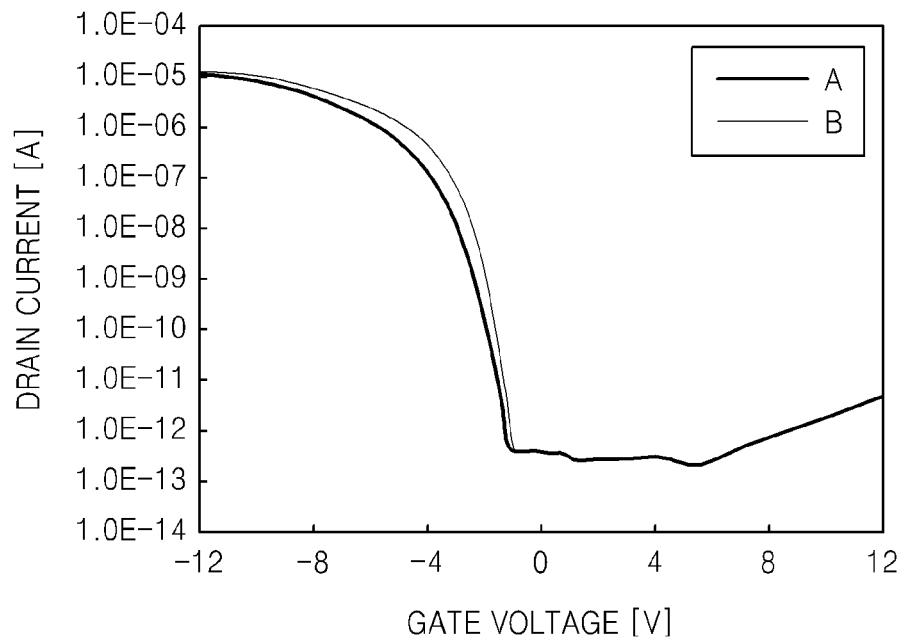
FIG. 18 is a graph showing curve changes of a gate voltage and a drain current of an OLED.

FIG. 18 is a graph showing the gate voltage and drain current of an OLED, when a flexible substrate having a structure A, in which a silicon nitride film is formed in the first barrier layer 1BL and a silicon nitride film is not formed in the second barrier layer 2BL, is used, and when a flexible substrate having a structure B, in which silicon nitride films having the same density are formed in the first and second barrier layers 1BL and 2BL, is used.

Referring to FIG. 18, the slope of the leftmost portion of the curve is higher for the structure B than for the structure A. However, a change in the slope of the curve generated when the structure B does not occur in all OLEDs, but only in some OLEDs. Thus, in the structure B, a compensation design of a current is desired such that the device characteristic is more uniform. However, when a driving voltage is reduced according to the compensation design, a low grayscale off defect, wherein insufficient brightness occurs for low grayscales, may be generated.

Table 5 below shows a low grayscale off defect generated based on 20 cd, when the flexible substrates having the structures A and B are used.

TABLE 5

| Structure of Flexible Substrate | A | B |
|---|---|---|
| Defect Ratio | 1.6% | 79.3% |

As shown in Table 5, in the structure B, the prevalence of low scale off defects significantly increases because a device characteristic of a TFT is disunified by hydrogen that is randomly generated in the silicon nitride film of the second barrier layer 2BL.

However, when the structure A is employed so as to decrease the number of such low grayscale off detects, a water vapor transmission rate that is an important characteristic of a barrier may be increased.

However, when the density of the silicon nitride of the at least one silicon nitride film 1SN of the first barrier layer 1BL is lower than the density of the silicon nitride of the at least one silicon nitride film 2SN of the second barrier layer 2BL, as is the case with the flexible substrate FS of the current embodiment, a deviation of a water vapor transmission rate of an OLED display may be reduced and characteristics of its TFTs may be improved.

Figure 19:
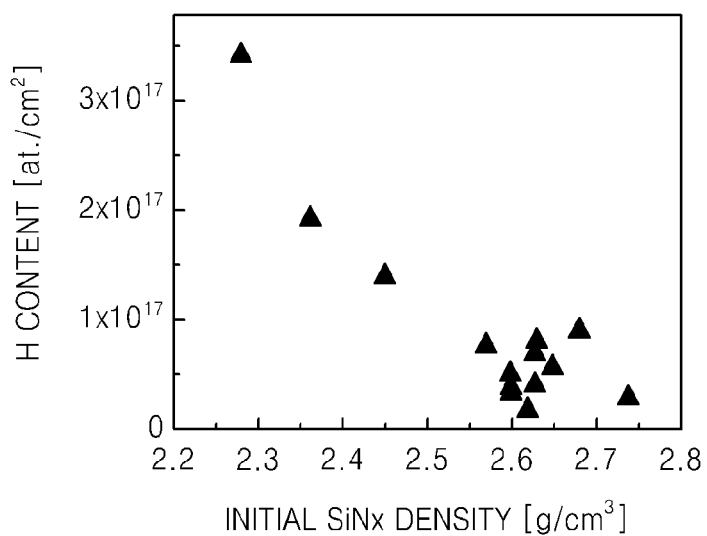
FIG. 19 is a graph showing a relationship between density of an initial silicon nitride film and hydrogen content.

FIG. 19 is a graph showing a relationship between density of an initial silicon nitride film and hydrogen content.

Referring to FIG. 19, the hydrogen content increases as the density of the initial silicon nitride film decreases. As in the current embodiment, the density of the silicon nitride of the at least one silicon nitride film 1SN of the first barrier layer 1BL may be less than or equal to 2.4 g/cm$^3$ so that the at least one silicon nitride film 1SN is formed to be porous. Here, it is difficult to form the at least one silicon nitride film 1SN such that the density of the silicon nitride is lower than 2.2 g/cm$^3$ due to process reasons. When the at least one silicon nitride film 1SN is porous, hydrogen content may be equal to or greater than $1 \times 10^{17}$ at./cm$^2$, thereby increasing an amount of hydrogen generated during a thermal process of the at least one silicon nitride film 1SN. Here, it is difficult to form the at least one silicon nitride film 1SN such that the hydrogen content is greater than $10 \times 10^{18}$ at./cm$^2$ due to process reasons. The increased hydrogen amount may cure a defect site of a TFT, thereby improving a device characteristic of the TFT. In addition, by including the at least one silicon nitride film 1SN in the first barrier layer 1BL, a water vapor transmission rate may also be improved.

Meanwhile, the density of the silicon nitride of the at least one silicon nitride film 1SN of the first barrier layer 1BL may be formed to be lower than the density of the silicon nitride of the at least one silicon nitride film 2SN of the second barrier layer 2BL, so that a refractive index of the at least one silicon nitride film 1SN of the first barrier layer 1BL is formed to be smaller than a refractive index of the at least one silicon nitride film 2SN of the second barrier layer 2BL.

Meanwhile, in FIG. 17, one silicon nitride film 1SN is formed on a silicon oxide film in the first barrier layer 1BL, but embodiments of the present invention are not limited thereto. For example, one silicon nitride film may be formed somewhere else in the first barrier layer 1BL, or in a different layer. Alternatively, a plurality of silicon nitride films may be formed in the first barrier layer 1BL. Alternatively, a plurality of silicon oxide films and a plurality of silicon nitride films may be formed in the first barrier layer 1BL.

FIGS. 5A through 10 are views for describing a method of manufacturing the OLED display 100, according to an embodiment of the present invention.

Figure 5A:
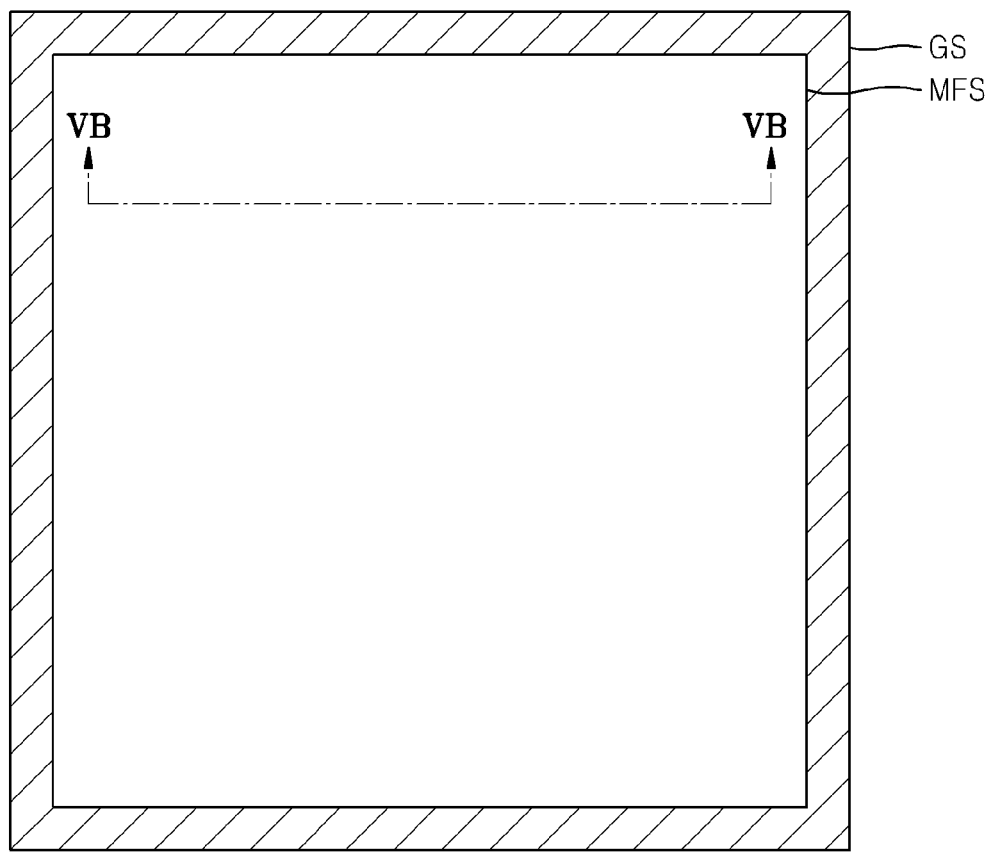
FIG. 5A is a plan view for describing a process of forming a mother flexible substrate on a glass substrate.
Figure 5B:
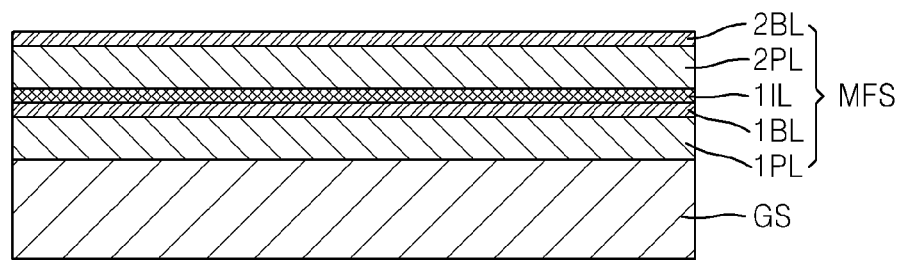
FIG. 5B is a cross-sectional view taken along a line VB-VB of FIG. 5A.

FIG. 5A is a plan view for describing a process of forming the mother flexible substrate MFS on the glass substrate GS, and FIG. 5B is a cross-sectional view taken along a line VB-VB of FIG. 5A.

Referring to FIGS. 5A and 5B, the mother flexible substrate MFS is formed on the glass substrate GS.

The mother flexible substrate MFS formed of a plastic material bends or is stretched when heat is applied, and thus it is difficult to precisely form thin film patterns, such as various electrodes or conductive wires, on the mother flexible substrate MFS. Accordingly, several thin film patterns are formed while adhering the mother flexible substrate MFS to the glass substrate GS that is a carrier substrate.

First, a first plastic layer 1PS is formed on the glass substrate GS. The first plastic layer 1PS may be formed by coating and hardening a plastic polymer solution including at least one of polyimide, polyethylene naphthalate, polyethylene terephthalate, polyarylate, polycarbonate, polyether imide, and polyethersulfone on the glass substrate GS, or by laminating a polymer film on the glass substrate GS. Here, examples of a hardening method include a heat hardening method, a UV hardening method, and an electronic beam hardening method.

Then, the first barrier layer 1BL is formed on the first plastic layer 1PS. The first barrier layer 1BL may be formed in a single layer or a multilayer by using an inorganic material, such as AlO3, SiO2, or SiNx, via chemical vapor deposition (CVD), plasma enhanced chemical vapor deposition (PECVD), or atomic layer deposition (ALD).

Then, the first intermediate layer 1IL is formed on the first barrier layer 1BL. The first intermediate layer 1IL may be formed in a single layer or a multilayer by using an amorphous material, such as amorphous silicon, or a metal thin film, such as ITO, Al, Ti, or Mo, via CVD, PECVD, or ALD.

Then, the second plastic layer 2PL is formed on the first intermediate layer 1IL. The second plastic layer 2PL may be formed of the same material as the first plastic layer 1PL via the same method.

Meanwhile, the second plastic layer 2PL may have lower viscosity than the first plastic layer 1PL. When the first and second plastic layers 1PL and 2PL are formed via coating, a high viscosity coating solution includes many impurities, and the impurities may also be coated. Accordingly, the second plastic layer 2PL may have lower viscosity than the first plastic layer 1PL so that filtering is performed while coating the second plastic layer 2PL. Here, impurities may be reduced by forming the second plastic layer 2PL using a filtered material, and since a coating material forming the second plastic layer 2PL has low viscosity, impurities generated in the first plastic layer 1PL and the first barrier layer 1BL may be covered.

Meanwhile, the first plastic layer 1PL and the second plastic layer 2PL have the same thickness in FIGS. 1 and 5A, but an embodiment of the present invention is not limited thereto. Penetration times of oxygen and moisture penetrating from outside the flexible substrate FS are affected more by the thickness of the second plastic layer 2PL closer to the OLED layer 120 than by that of the first plastic layer 1PL. Accordingly, by forming the second plastic layer 2PS closer to the OLED layer 120 to be thicker than the first plastic layer 1PL, the penetration times are delayed, thereby preventing deterioration of an OLED.

Then, the second barrier layer 2BL is formed on the second plastic layer 2PL. The second barrier layer 2BL may be formed of the same material as the first barrier layer 1BL via the same method.

Figure 6A:
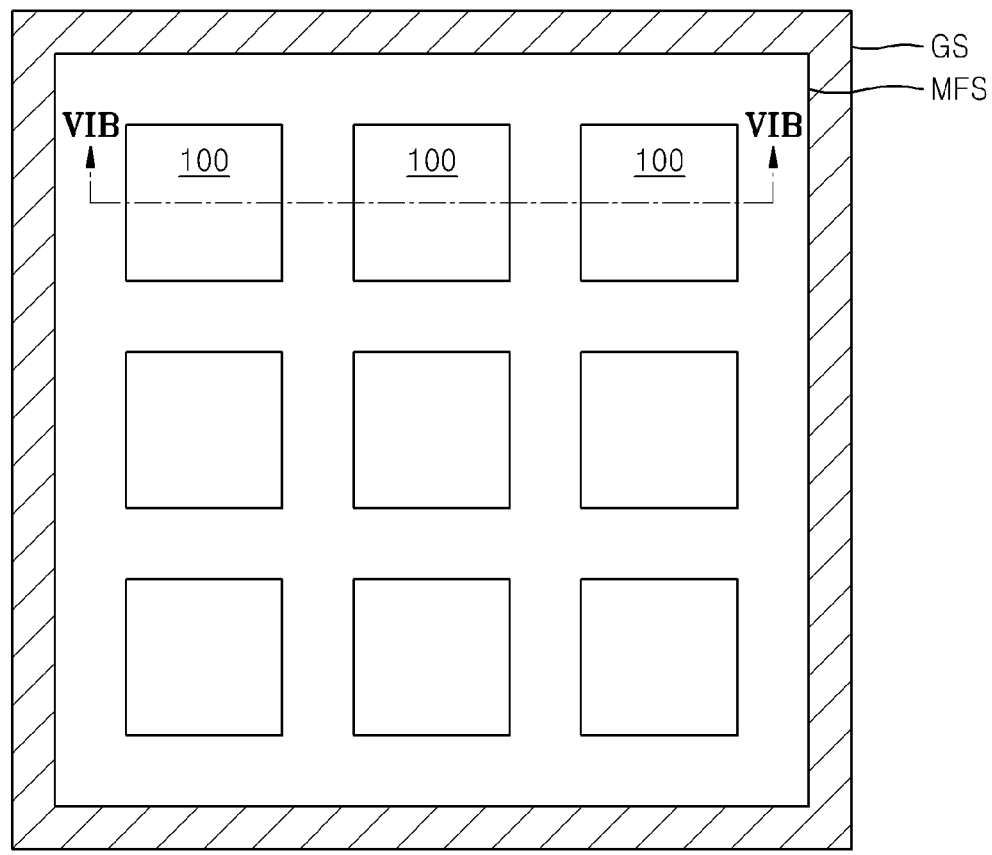
FIG. 6A is a plan view for describing a process of forming a plurality of units of OLED displays on a mother flexible substrate.
Figure 6B:
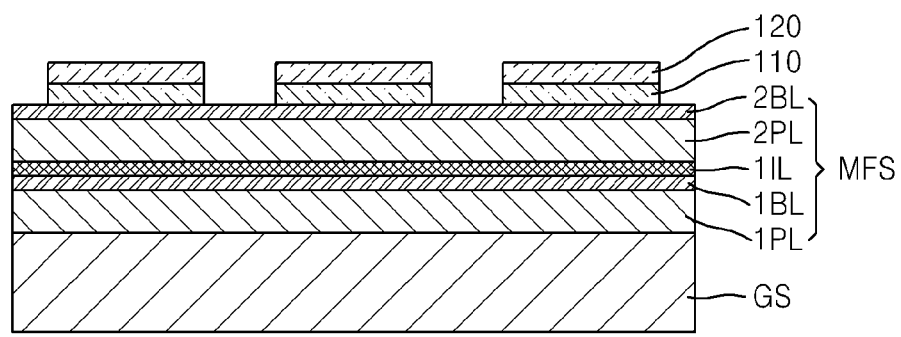
FIG. 6B is a cross-sectional view taken along a line VIB-VIB of FIG. 6A.

FIG. 6A is a plan view for describing a process of forming a plurality of units of OLED displays 100 on the mother flexible substrate MFS, and FIG. 6B is a cross-sectional view taken along a line VIB-VIB of FIG. 6A.

Referring to FIGS. 6A and 6B, the plurality of units of OLED displays 100 including the TFT layer 110 and the OLED layer 120 are formed on the mother flexible substrate MFS.

Various methods may be applied according to the semiconductor layer 111 (refer to FIG. 2) forming the TFT layer 110. For example, when crystalline silicon, amorphous silicon, or conductive oxide is used as the semiconductor layer 111, the semiconductor layer 111 may be formed via a deposition method, such as a PECVD method, an atmospheric pressure CVD (APCVD) method, or a low pressure CVD (LPCVD) method, and when an organic TFT is applied as the semiconductor layer 111, a coating method or a printing method may be used. Alternatively, when polycrystalline silicon is used as the semiconductor layer 111, amorphous silicon may be crystallized by using any one of various crystallization methods, such as rapid thermal annealing (RTA), solid phase crystallization (SPC), excimer laser annealing (ELA), metal induced crystallization (MIC), metal induced lateral crystallization (MILC), and sequential lateral solidification (SLS).

The gate electrode 113 (refer to FIG. 2), the source electrode 115 (refer to FIG. 2), the drain electrode 116 (refer to FIG. 2), a capacitor (not shown), and various wires (not shown) may be deposited on the TFT layer 110 via CVD, PECVD, or ALD, and the TFT layer 110 may be patterned via a photolithography process.

The layer 123 (refer to FIG. 2) including the organic emission layer of the OLED layer 120 may be formed via any one of various methods, such as a deposition method, a coating method, a printing method, and a light-heat transfer method.

Although not shown in FIG. 6B, a buffer layer (not shown) may be further disposed between the second barrier layer 2BL and the TFT layer 110.

Figure 7:
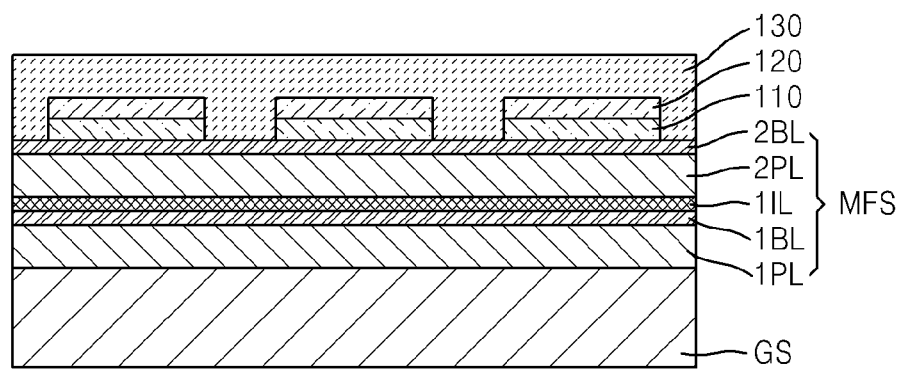
FIG. 7 is a cross-sectional view for describing a process of forming a thin-film encapsulation layer for encapsulating a plurality of OLED layers on a mother flexible substrate.

FIG. 7 is a cross-sectional view for describing a process of forming the thin-film encapsulation layer 130 for encapsulating a plurality of the OLED layers 120 on the mother flexible substrate MFS.

As described above, the thin-film encapsulation layer 130 may be formed of a plurality of inorganic layers or a combination of an inorganic layer and an organic layer. The inorganic layer and the organic layer may be formed via any one of various methods, such as a CVD method, a PECVD method, and a sputtering method.

Meanwhile, in FIG. 7, the thin-film encapsulation layer 130 commonly covers the entire plurality of units of OLED displays 100, but an embodiment of the present invention is not limited thereto. In other words, the thin-film encapsulation layer 130 may individually cover the units of OLED displays 100.

Figure 8:
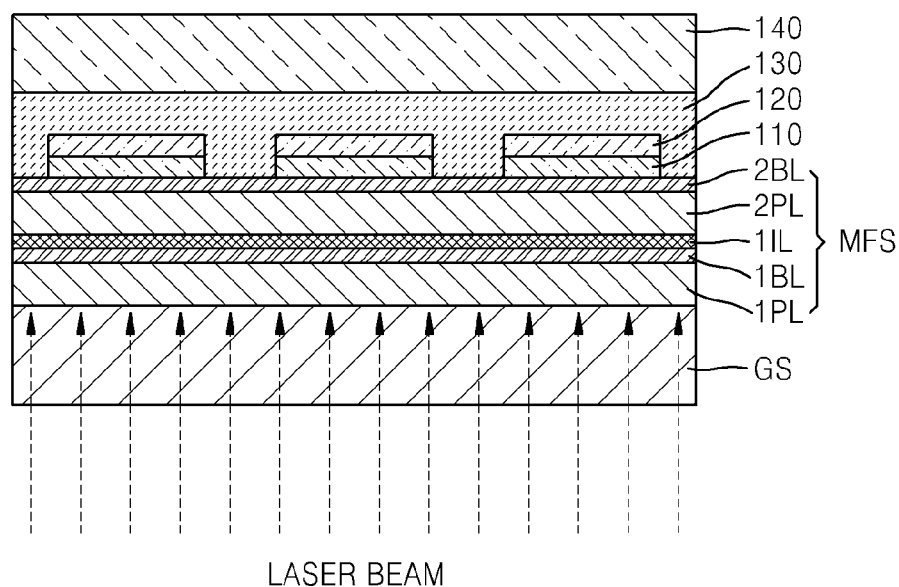
FIGS. 8 and 9 are cross-sectional views for describing a process of separating a glass substrate and a mother flexible substrate.
Figure 9:
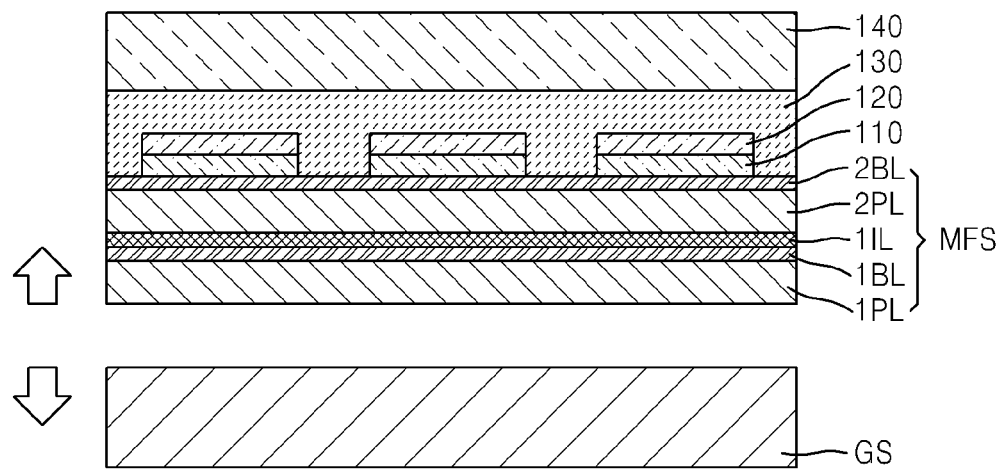

FIGS. 8 and 9 are cross-sectional views for describing a process of separating the glass substrate GS and the mother flexible substrate MFS.

Referring to FIG. 8, in order to separate the mother flexible substrate MFS from the glass substrate GS, a laser beam is irradiated onto a surface of the glass substrate GS opposite to where the mother flexible substrate MFS is formed.

The laser beam may be a UV light irradiated by using an excimer laser. The irradiated UV light penetrates through the glass substrate GS, and is absorbed by the first and second plastic layers 1PL and 2PL. A binding force between the first and second plastic layers 1PL and 2PL and the glass substrate GS is weakened by absorbed energy. Also, the first and second barrier layers 1BL and 2BL are easily broken by external tension. Accordingly, by suitably applying the external tension to the mother flexible substrate MFS and the glass substrate GS in directions indicated by arrows of FIG. 9, the mother flexible substrate MFS may be separated from the glass substrate GS.

Meanwhile, a first protection film 140 may be applied to the thin-film encapsulation layer 130 before the process of separating the mother flexible substrate MFS and the glass substrate GS. The first protection film 140 may be an optical member, such as a polarization film.

Figure 10:
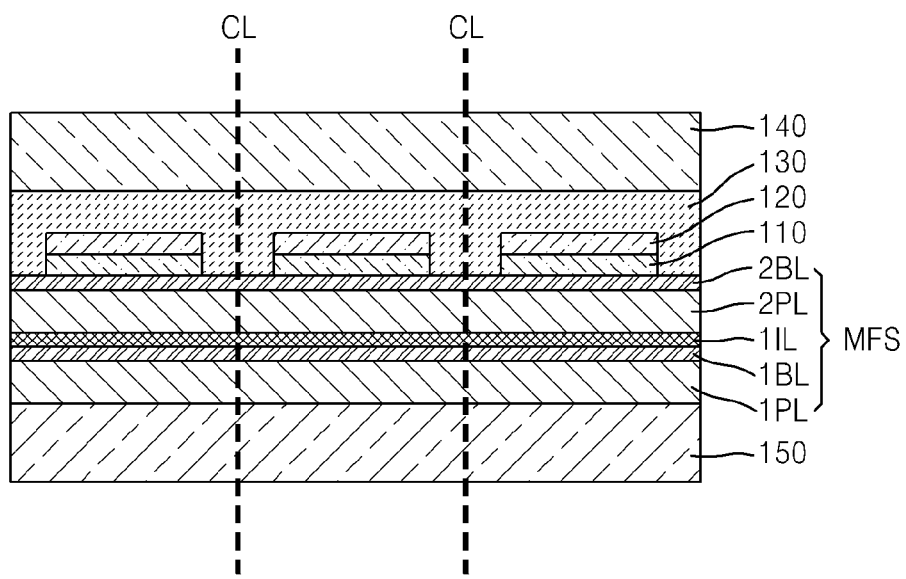
FIG. 10 is a cross-sectional view for describing a process of dividing an OLED layer formed on a mother flexible substrate into a plurality of units of OLED displays.

FIG. 10 is a cross-sectional view for describing a process of dividing the OLED layer 120 formed on the mother flexible substrate MFS into the plurality of units of OLED displays 100.

After separating the mother flexible substrate MFS from the glass substrate GS, a second protection film 150 is adhered to a rear surface of the mother flexible substrate MFS, and then the mother flexible substrate MFS may be divided into the plurality of units of OLED displays 100. The second protection film 150 may be an optical member, such as a polarization film.

The OLED layer 120 formed on the mother flexible substrate MFS may be divided into the plurality of units of OLED displays 100 by cutting the mother flexible substrate MFS along a cutting line CL in a non-display region between the OLED displays 100 by using a cutting wheel or a laser cutter.

A method of manufacturing a mother flexible substrate MFS-1 of the OLED display 100 according to another embodiment of the present invention will now be described with reference to FIGS. 11A and 11B.

Figure 11A:
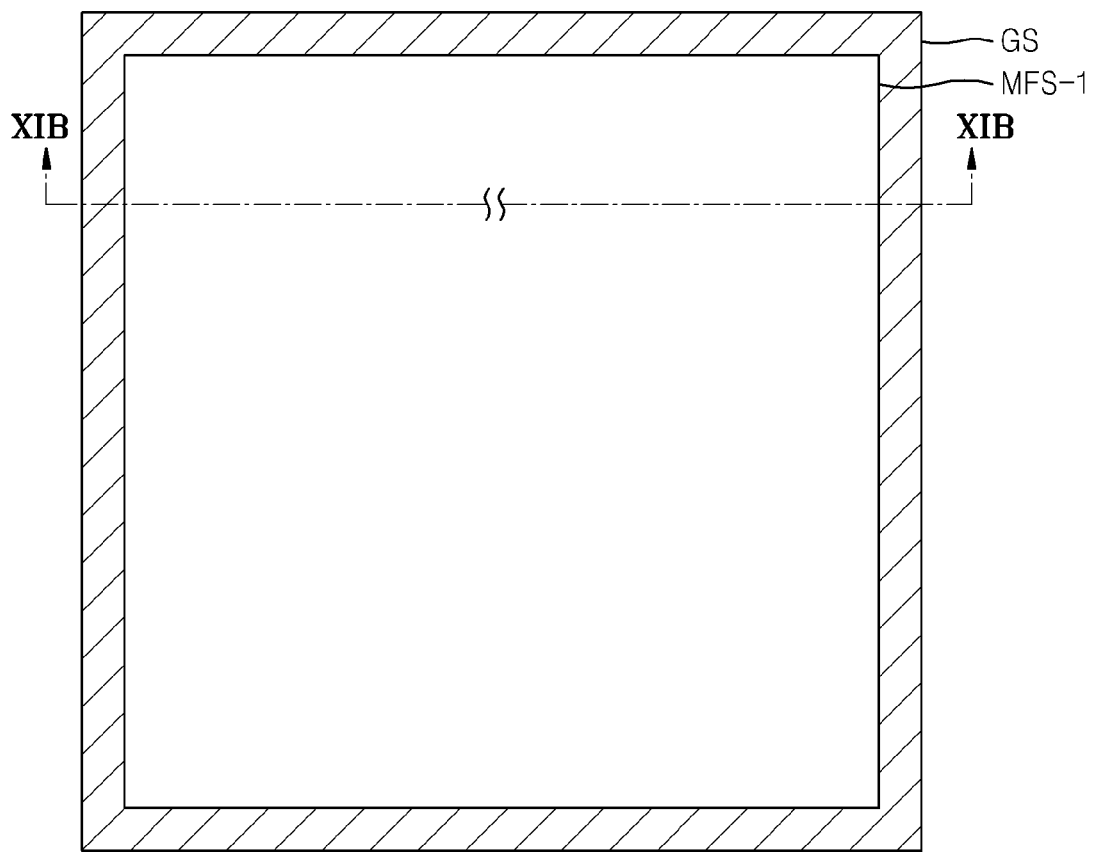
FIG. 11A is a plan view for describing a process of forming a mother flexible substrate on a glass substrate.
Figure 11B:
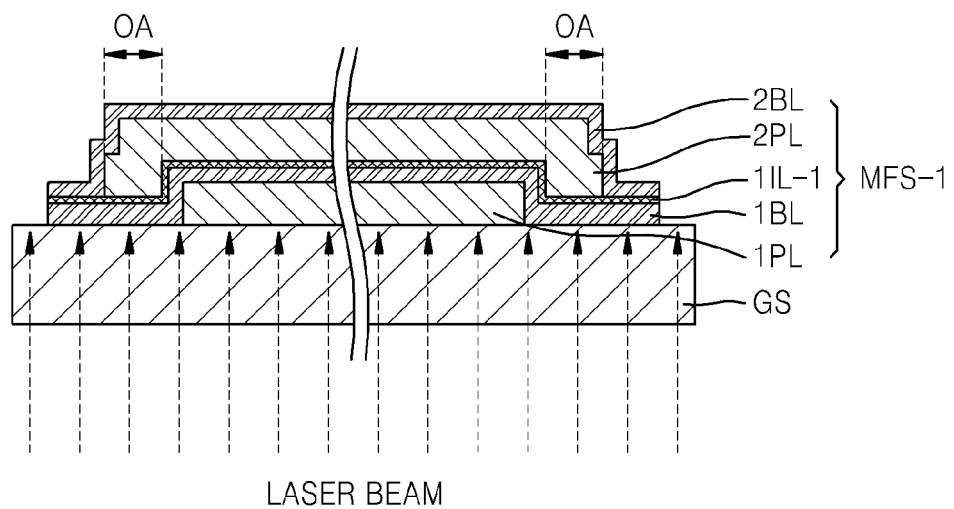
FIG. 11B is a cross-sectional view taken along a line XIB-XIB of FIG. 11A.

FIG. 11A is a plan view for describing a process of forming the mother flexible substrate MFS-1 on the glass substrate GS, and FIG. 11B is a cross-sectional view taken along a line XIB-XIB of FIG. 11A. FIGS. 11A and 11B particularly illustrate in detail an outer region of bonding surfaces of the glass substrate GS and the mother flexible substrate MFS-1.

The first plastic layer 1PL and the second plastic layer 2PL formed on the glass substrate GS are respectively covered by the first barrier layer 1BL and the second barrier layer 2BL.

If an organic coating solution flows outside the glass substrate GS while forming the first and second plastic layers 1PL and 2PL on the glass substrate GS via a coating process, the organic coating solution that flowed outside the glass substrate GS generates a defect. Accordingly, the first and second plastic layers 1PL and 2PL are coated in a region smaller than the glass substrate GS. On the other hand, since the first and second barrier layers 1BL and 2BL are formed via a deposition method, such as CVD or PECVD, the first and second barrier layers 1BL and 2BL are formed closer to an end of the glass substrate GS than the first and second plastic layers 1PL and 2PL.

The second plastic layer 2PL slightly covers, or extends beyond one or more outer edges of, the first plastic layer 1PL. Even if the second plastic layer 2PL is formed at the same location as the first plastic layer 1PL, the second plastic layer 2PL flows to an outer region of the first plastic layer 1PL due to fluidity of a coating solution. The first intermediate layer 1IL has the same size as the first and second barrier layers 1BL and 2BL. Accordingly, the outer region of the mother flexible substrate MFS-1 has an overlapping region OA where a first intermediate layer 1IL-1 and the second plastic layer 2PL overlap each other.

While separating the mother flexible substrate MFS-1 and the glass substrate GS, an irradiated UV light has to penetrate through the glass substrate GS and be absorbed into the first and second plastic layers 1PL and 2PL, but in the overlapping region OA, the first intermediate layer 1IL-1 absorbs the UV light, and thus the UV light is prevented from being absorbed in the second plastic layer 2PL. Accordingly, it may be difficult to separate the mother flexible substrate MFS-1 from the glass substrate GS.

Accordingly, the first intermediate layer 1IL-1 may be formed such that the UV light suitably penetrates therethrough. For example, the first intermediate layer 1IL-1 may have UV light transmittance of at least 10%. The first intermediate layer 1IL-1 may have the UV light transmittance of at least 10% by suitably adjusting a thickness of the first intermediate layer 1IL-1 by adjusting a time of forming the first intermediate layer 1IL-1. For example, the thickness of the first intermediate layer 1IL-1 may be lower than or equal to about 100 Å.

Figure 12:
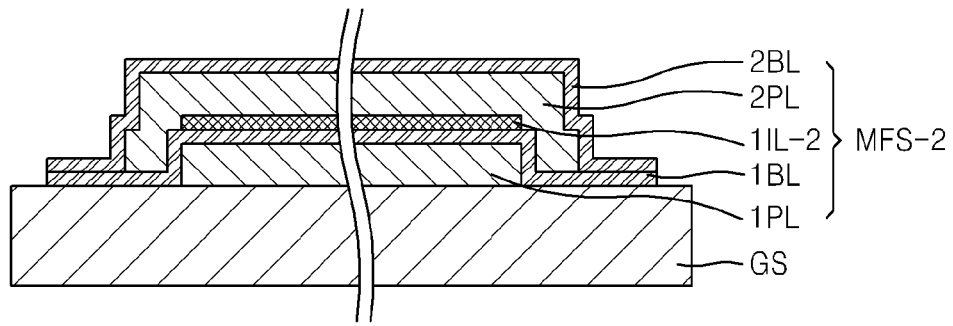
FIG. 12 is a cross-sectional view for describing a method of manufacturing the OLED display of FIG. 1, according to an embodiment of the present invention.

FIG. 12 is a cross-sectional view for describing a method of manufacturing the OLED display 100 of FIG. 1, according to an embodiment of the present invention.

Referring to FIG. 12, a first intermediate layer 1IL-2 is formed to be smaller than or equal in area to the first plastic layer 1PL while forming a mother flexible substrate MFS-2.

In FIGS. 11A and 11B, the UV light transmittance of the first intermediate layer 1IL-1 is adjusted by adjusting the thickness of the first intermediate layer 1IL-1 in the overlapping region OA of the outer region of the mother flexible substrate MFS-1, whereas in FIG. 12, the first intermediate layer 1IL-2 is formed to be smaller than or equal in area to the first plastic layer 1PL so that the overlapping region OA is fundamentally not formed in the outer region. In other words, an end of the second plastic layer 2PL and an end of the first barrier layer 1BL directly contact each other at an end of the glass substrate GS. Accordingly, the mother flexible substrate MFS-2 may be smoothly separated from the glass substrate GS.

Figure 13:
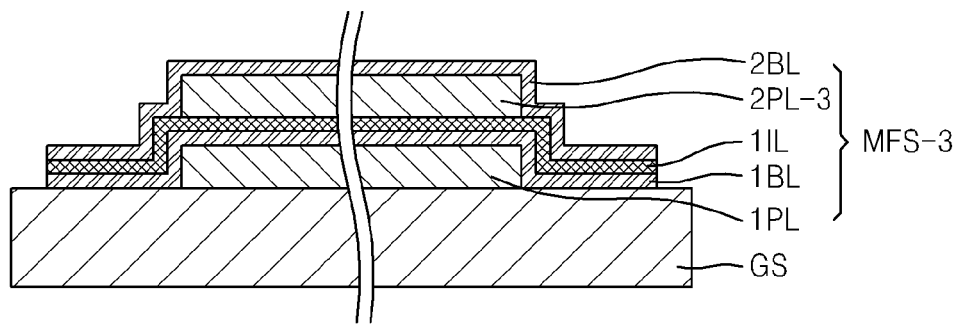
FIG. 13 is a cross-sectional view for describing a method of manufacturing the OLED display of FIG. 1, according to another embodiment of the present invention.

FIG. 13 is a cross-sectional view for describing a method of manufacturing the OLED display 100 of FIG. 1, according to another embodiment of the present invention.

Referring to FIG. 13, a second plastic layer 2PL-3 is formed to be smaller than or equal in area to the first plastic layer 1PL while forming a mother flexible substrate MFS-3.

By forming the second plastic layer 2PL-3 to be smaller than or equal in area to the first plastic layer 1PL, the overlapping region OA of the second plastic layer 2PL-3 and the first intermediate layer 1IL is fundamentally not formed in the outer region as described above with reference to FIG. 12. Accordingly, the mother flexible substrate MFS-3 and the glass substrate GS may be more readily separated from each other. Here, since the second plastic layer 2PL-3 flows on the first plastic layer 1PL during a coating process, an area of the second plastic layer 2PL-3 may be designed smaller than an actual area to be formed during a designing process.

Figure 14:
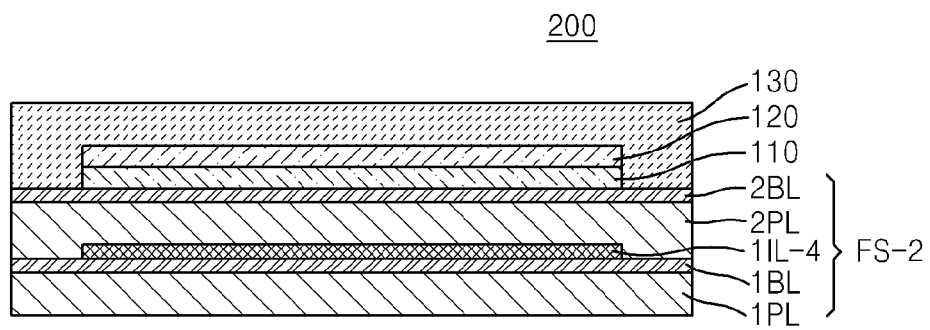
FIG. 14 is a cross-sectional view of an OLED display according to another embodiment of the present invention.

FIG. 14 is a cross-sectional view of an OLED display 200 according to another embodiment of the present invention.

Referring to FIG. 14, the OLED display 200 includes the flexible substrate FS-2, the TFT layer 110, the OLED layer 120, and the thin-film encapsulation layer 130. The current embodiment will be described mainly based on differences between the OLED display 200 and the OLED display 100, and like reference numerals shall be understood based on the above descriptions thereof.

The flexible substrate FS-2 of the OLED display 200 includes the first plastic layer 1PL, the first barrier layer 1BL, a first intermediate layer 1IL-4, the second plastic layer 2PL and the second barrier layer 2BL.

The first intermediate layer 1IL-4 of the current embodiment is patterned to be located in a region where the OLED layer 120 is formed.

Figure 15A:
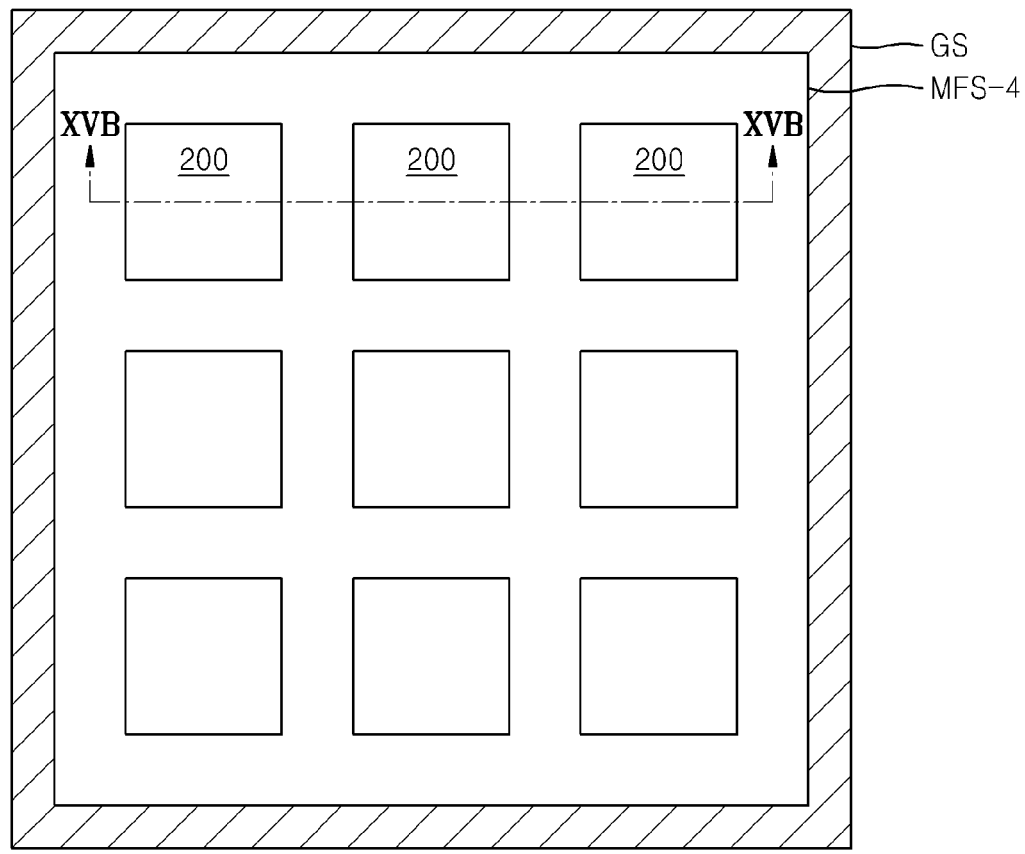
FIGS. 15A and 15B are respectively a plan view and a cross-sectional view for describing a method of manufacturing the OLED display of FIG. 14, according to an embodiment of the present invention.
Figure 15B:
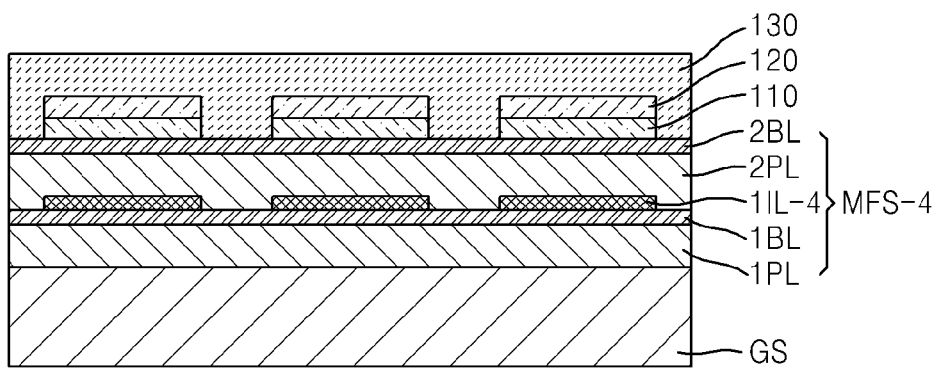

FIGS. 15A and 15B are respectively a plan view and a cross-sectional view for describing a method of manufacturing the OLED display 200 of FIG. 14, according to an embodiment of the present invention.

FIG. 15A is a plan view for describing a process of forming a mother flexible substrate MFS-4 on the glass substrate GS, and FIG. 15B is a cross-sectional view taken along line XVB-XVB of FIG. 15A.

Referring to FIGS. 15A and 15B, the first plastic layer 1PL and the first barrier layer 1BL are sequentially formed on the glass substrate GS, and then the first intermediate layer 1IL-4 is formed.

Here, the first intermediate layer 1IL-4 is formed only in regions corresponding to units of OLED displays 200, and is not formed in a non-display region between the OLED displays 200. Accordingly, in dividing of the mother flexible substrate MFS-4 into the plurality of units of OLED displays 200, an inorganic layer, such as the first intermediate layer 1IL-4, is formed without reaching a cutting line so that a crack or contamination generated by the inorganic layer during cutting is reduced.

Also, since the first intermediate layer 1IL-4 is not formed at the end of the glass substrate GS, the first intermediate layer 1IL-4 and the second plastic layer 2PL do not overlap at the end of the glass substrate GS. In other words, the end of the second plastic layer 2PL and the end of the first barrier layer 1BL directly contact each other at the end of the glass substrate GS. Accordingly, the mother flexible substrate MFS-4 and the glass substrate GS may be more readily separated from each other.

Figure 16:
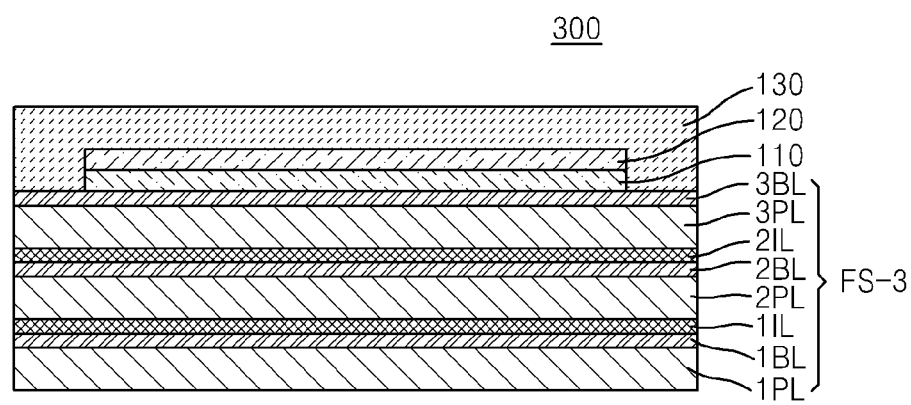
FIG. 16 is a cross-sectional view of an OLED display according to another embodiment of the present invention.

FIG. 16 is a cross-sectional view of an OLED display 300 according to another embodiment of the present invention.

Referring to FIG. 16, the OLED display 300 includes a flexible substrate FS-3, the TFT layer 110, the OLED layer 120, and the thin-film encapsulation layer 130. The current embodiment will be described mainly based on differences between the OLED display 300 and the OLED display 100, and like reference numerals shall be understood based on the above descriptions thereof.

The flexible substrate FS-3 of the OLED display 300 includes the first plastic layer 1PL, the first barrier layer 1BL, the first intermediate layer 1IL, the second plastic layer 2PL, a second intermediate layer 2IL, the second barrier layer 2BL, a third plastic layer 3PL, and a third barrier layer 3BL.

In other words, the flexible substrate FS-3 of the OLED display 300 is formed by alternately stacking three plastic layers and three barrier layers, and disposing intermediate layers between adjacent plastic and barrier layers. Since an average water vapor transmission path is longer in the OLED display 300 than in the OLED display 100, penetration of oxygen and moisture may be further prevented.

Although not shown in detail in FIG. 16, the first through third barrier layers 1BL through 3BL of the flexible substrate FS-3 may each include at least one silicon nitride film (not shown).

The density of silicon nitride of the silicon nitride film of the first barrier layer 1BL may be lower than the density of silicon nitride of the silicon nitride film of the third barrier layer 3BL. For example, the density of the silicon nitride of the silicon nitride film of the first barrier layer 1BL may be less than or equal to 2.4 g/cm$^3$. Here, it is difficult to form the first barrier layer 1BL such that the density of the silicon nitride is less than 2.2 g/cm$^3$ due to process reasons. Similarly, a refractive index of the silicon nitride film of the first barrier layer 1BL may be smaller than a refractive index of the silicon nitride film of the third barrier layer 3BL.

As such, by forming the silicon nitride film of the first barrier layer 1BL to have a density of silicon nitride less than or equal to 2.4 g/cm$^3$, such that the silicon nitride film is porous, a hydrogen amount generated during a thermal process of the silicon nitride film may be increased. The increased hydrogen amount may cure a defect site of a TFT, thereby improving a device characteristic of the TFT. In addition, by including the silicon nitride film 1SN in the first barrier layer 1BL, a water vapor transmission rate may also be improved.

Meanwhile, in FIG. 16, three plastic layers and three barrier layers are alternately stacked on each other, but a greater number of plastic and barrier layers may be stacked if required. Here, an intermediate layer is further disposed between adjacent plastic and barrier layers if required.

The first and second intermediate layers 1IL and 2IL may be patterned as described above with reference to FIG. 14.

Also, the above embodiments are described based on a structure of an OLED display, but the embodiments of the present invention may also be applied to various flexible displays. For example, the embodiments of the present invention may be applied to various electronic devices, such as mobile devices, navigations, video cameras, lap tops, tablet PCs, flat TVs, and beam projectors.

As described above, according to the one or more of the above embodiments of the present invention, a flexible substrate is formed by alternately stacking two plastic layers and two barrier layers and then disposing an intermediate layer between adjacent plastic and barrier layers, thereby increasing an average water vapour transmission path so as to prevent deterioration of an OLED.

An adhesive strength between a lower barrier layer and an adjacent upper plastic layer is increased, and thus a detachment defect of an OLED display may be improved.

By forming barrier layers to include a silicon nitride, where the density of silicon nitride in a barrier layer disposed far from an OLED is less than the density of silicon nitride in a barrier layer disposed closer to the OLED, a TFT characteristic may be improved and the water vapor transmission rate of a flexible substrate may be decreased.

While one or more embodiments of the present invention have been described with reference to the figures, it will be understood by those of ordinary skill in the art that various changes in form and details may be made therein without departing from the spirit and scope of the present invention as defined by the following claims. Various features of the embodiments shown can be mixed and matched in any manner, to produce further embodiments contemplated by the invention.

What is claimed is:

1. An organic light-emitting diode (OLED) display comprising:
   first and second plastic layers;
   a first barrier layer and a first intermediate layer each positioned between the first and second plastic layers; and
   an OLED layer formed on the second plastic layer; and
   a second barrier layer formed on the second plastic layer;
   wherein the first barrier layer comprises silicon nitride;
   wherein the second barrier layer comprises silicon nitride; and wherein a density of the silicon nitride in the first barrier layer is lower than a density of the silicon nitride in the second barrier layer.

2. The OLED display of claim 1, wherein the silicon nitride is present within the first barrier layer at a density of equal to or more than 2.2 g/cm$^3$ and less than or equal to 2.4 g/cm$^3$.

3. The OLED display of claim 1, wherein a refractive index of the first barrier layer is lower than a refractive index of the second barrier layer.

4. The OLED display of claim 1, further comprising:
   a third plastic layer formed over the second plastic layer; and
   a third barrier layer formed between the second and third plastic layers.

5. The OLED display of claim 4, wherein the third barrier layer comprises silicon nitride.

6. The OLED display of claim 5, wherein a density of the silicon nitride in the first barrier layer is lower than a density of the silicon nitride in the third barrier layer.

7. The OLED display of claim 5, wherein a refractive index of the first barrier layer is lower than a refractive index of the third barrier layer.

8. The OLED display of claim 1, wherein a hydrogen content of the silicon nitride film is equal to or more than $1\times10^{17}$ at./cm$^2$ and less than or equal to $1\times10^{18}$ at./cm$^2$.

* * * * *